United States Patent [19]
Mohindra et al.

[11] Patent Number: 5,634,978
[45] Date of Patent: *Jun. 3, 1997

[54] ULTRA-LOW PARTICLE SEMICONDUCTOR METHOD

[75] Inventors: Raj Mohindra, Los Altos Hills; Abhay Bhushan, Palo Alto; Rajiv Bhushan, Mountain View; Suraj Puri, Los Altos; John H. Anderson, Sr., Milpitas; Jeffrey Nowell, San Francisco, all of Calif.

[73] Assignee: YieldUP International, Mountain View, Calif.

[*] Notice: The term of this patent shall not extend beyond the expiration date of Pat. No. 5,571,337.

[21] Appl. No.: 339,326

[22] Filed: Nov. 14, 1994

[51] Int. Cl.$^6$ .............................. B08B 3/08; B08B 11/00
[52] U.S. Cl. .................... 134/2; 34/78; 134/254; 134/30; 134/32; 134/37
[58] Field of Search .................... 34/78; 134/2, 25.4, 134/25.5, 26, 30, 32, 37, 902

[56] References Cited

U.S. PATENT DOCUMENTS

| | | | |
|---|---|---|---|
| 4,633,893 | 1/1987 | McConnell et al. | 134/95 |
| 4,750,505 | 6/1988 | Inuta et al. | 134/153 |
| 4,778,532 | 10/1988 | McConnell et al. | 134/10 |
| 4,871,417 | 10/1989 | Nishizawa et al. | 156/640 |
| 4,874,014 | 10/1989 | Grant et al. | 137/606 |
| 4,911,761 | 3/1990 | McConnell et al. | 134/11 |
| 4,917,123 | 4/1990 | McConnell et al. | 134/95 |
| 4,984,597 | 1/1991 | McConnell et al. | 134/95 |
| 4,987,687 | 1/1991 | Sugimoto | 34/58 |
| 5,082,518 | 1/1992 | Molinaro | 156/345 |
| 5,129,955 | 7/1992 | Tanaka | 134/2 |
| 5,143,103 | 9/1992 | Basso et al. | 134/98.1 |
| 5,156,174 | 10/1992 | Thompson et al. | 134/153 |
| 5,169,408 | 12/1992 | Biggerstaff et al. | 29/25.01 |
| 5,228,206 | 7/1993 | Grant et al. | 34/1 |
| 5,286,657 | 2/1994 | Bran | 437/9 |
| 5,421,905 | 6/1995 | Ueno et al. | 134/25.4 |

FOREIGN PATENT DOCUMENTS

| | | |
|---|---|---|
| 0385536A1 | 5/1990 | European Pat. Off. |
| 385 536 | 9/1994 | European Pat. Off. |
| 62-188323 | 8/1987 | Japan |
| 3-124026 | 5/1991 | Japan |
| 4-83340 | 3/1992 | Japan |
| 4-192419 | 7/1992 | Japan |
| 4-251930 | 9/1992 | Japan |
| 5-283386 | 10/1993 | Japan |
| 5-283391 | 10/1993 | Japan |
| 5-326464 | 12/1993 | Japan |
| 6-163500 | 6/1994 | Japan |
| 6-163501 | 10/1994 | Japan |

OTHER PUBLICATIONS

D.J. Riley and R.G. Carbonell, "The Deposition of Contaminants from Deionized Water onto Hydrophobic Silicon Wafers", Journal of the IES, pp. 28–34, Nov./Dec. 1991.

(List continued on next page.)

*Primary Examiner*—Jill Warden
*Attorney, Agent, or Firm*—Townsend and Townsend and Crew LLP

[57] ABSTRACT

A method operates a system for wet processing of semiconductors. The system includes an inlet coupled to a fluid source, and a filter coupled to the inlet. The system also includes a sealed vessel coupled to the filter where the sealed vessel has a lower liquid portion and an upper vapor portion. The system further includes an outlet coupled to the sealed vessel. The outlet is attached to the lower liquid portion. A solvent injector coupled to the sealed vessel is also used. The solvent injector is coupled to the upper vapor portion, and supplies a gaseous mixture including a polar organic compound. The polar organic compound is a non-saturated polar organic vapor. The system also includes a gas source coupled to the sealed vessel. The gas source is coupled to the upper vapor portion, and supplies an inert gas into the upper vapor portion. A device for removing the liquid from the lower liquid portion at substantially a constant liquid level rate is also included.

28 Claims, 5 Drawing Sheets

OTHER PUBLICATIONS

N.D. Casper and B. W. Soren, "Semiconductor Yield Enhancement through Particle Control", Emerging Semiconductor Technology, pp. 423–435.

M. Itano, F. W. Kern, Jr., R. W. Rosenberg, M. Miyashita, I. Kawanabe, and T. Ohmi, "Particle Deposition and Removal in Wet Cleaning Processes for ULSI Manufacturing,", IEEE Trans. on Semiconductor Manufacturing, vol. 5, No. 2, pp. 114–120, May 1992.

Y. Yagi, T. Imaoka, Y. Kasama, and T. Ohmi, "Advanced Ultrapure Water Systems with Low Dissolved Oxygen for Native Oxide Free Wafer Processing", IEEE Trans. On Semiconductor Manufacturing, vol. 5, No. 2, pp. 121–127, May 1992.

H. G. Parks J.F. O'Hanlon, and F. Shadman, "Research Accomplishments at the University of Arizona Sematech Center of Excellence for Contamination/Defect Assessment and Control", IEEE Trans. on Semiconductor Manufacturing, vol. 6 No. 2, pp. 134–142, May 1993.

C.S. Ackerman and J.M. Fabia, "Monitoring Supplier Quality at PPM Levels", IEEE Trans. on Semiconductor Manufacturing, vol. 6 No. 2, pp. 189–194, May 1993.

G.D. Moss, J.N. DiBello, K.P. Yanders, and R.F. Orr, "Capillary Drying: Particle–Free Wet–Process Drying?" No date.

T. Ohmi, Ultra Clean Technology Handbook, p. 290, 1993.

J. Marra, "Ultra Clean Marangoni Drying", pp. 269–282 No date.

C. McConnell, "Examining the Effects of Wafer Surface Chemistry on Particle Removal Using Direct–Displacement Isopropyl Alcohol Drying", MicroContamination, Feb. 1991.

P. Burggraaf, "Keeping the 'RCA' in Wet Chemistry Cleaning", Semiconductor International, pp. 86–90, Jun. 1994.

M.B. Olesen, "A Comparative Evaluation of the Spin Rinser/Dryer with the IPA Vapor Isodry Technique", Proceedings – Institute of Environmental Sciences, pp. 229–241, 1990.

ULTRA-LOW PARTICLE SEMICONDUCTOR METHOD

BACKGROUND OF THE INVENTION

The present invention relates to the field of semiconductor integrated circuits. The invention is illustrated in an example with regard a semiconductor integrated circuit wet processing method and apparatus, but it will be recognized that the invention has a wider range of applicability. Merely by way of example, the invention can also be applied to the manufacture of raw wafers, disks and heads, flat panel displays, microelectronic masks, and other applications requiring high purity wet processing such as steps of rinsing, drying, and the like.

Industry utilizes or has proposed various techniques to rinse and dry a semiconductor wafer. An example of a conventional technique used to rinse a wafer is a cascade rinse. The cascade rinse utilizes a cascade rinser which includes inner and outer chambers, each separated by a partition. Rinse water flows from a water source into the inner chamber. The rinse water from the inner chamber cascades into the outer chamber. An in-process wafer such as an etched wafer is typically rinsed in the cascade rinser by dipping the etched wafer into the rinse water of the inner chamber. This process is often used to neutralize and remove acid from the etched wafer.

A limitation with the cascade rinser is "dirty water" often exists in the first chamber. The dirty water typically includes residual acid as well as "particles" which often attach to the wafer. These particles often cause defects in the integrated circuit, thereby reducing the number of good dies on a typical wafer. Another limitation with the cascade rinser is wafers from the cascade rinser must still undergo a drying operation. A subsequent drying operation often introduces more particles onto the integrated circuit. More particles on the integrated circuit typically further decrease the number of good dies on the wafer.

Another technique often used to rinse wafers is the "quick dump" method. The quick dump method relies upon the rapid deployment of water from the rinse tank to remove water and impurities from the semiconductor wafer. A limitation with this method is its inability to actually clean or remove particles from the wafer. In fact, the rapid deployment of water from the tank often transfers more particles onto the wafer. In addition, the wafers from the quick dump tank must still undergo a drying operation, further increasing the number of particles on the wafer. As previously noted, more particles often relates to lower die yields on the semiconductor wafer.

A further technique used to both rinse and dry wafers relies upon a spin rinse/dryer. The spin rinse/dryer uses a combination of rinse water spray to rinse and centrifugal force to remove water from the semiconductor wafer. The dry step often removes the water from the semiconductor wafer substantially by centrifugal force and evaporation. However, the spin rinse/dryer often introduces more particles onto the wafer. In fact, initially dissolved or suspended contaminants such as particles in the water are often left on the semiconductor wafer, thereby reducing the number of good dies on the wafer. Another limitation with the spin rinse/dryer is its complex mechanical design with moving parts and the like. The complex mechanical design often leads to certain problems such as greater downtime, wafer breakage, more spare parts, greater costs, among others. A further limitation is static electricity often builds up on the wafers during the spin cycle, thereby attracting even more particles onto the surface of the semiconductor.

Another technique used to dry wafers is an isopropyl alcohol (IPA) vapor dryer, full displacement IPA dryer, and others. These IPA-type dryers often rely upon a large quantity of a solvent such as isopropyl alcohol and other volatile organic liquids to facilitate drying of the semiconductor wafer. A limitation with this type of dryer is its use of the large solvent quantity which is highly flammable and extremely hazardous to health and environment. Another limitation with such a dryer is its cost, which is often quite expensive. Still further, it has been determined that large quantities of hot solvent are typically incompatible with certain resist patterned wafers, and are also detrimental to certain device structures.

Still another technique relies upon a hot DI process water to rinse and promote drying of the semiconductor wafer. By way of the hot deionized (DI) water, the liquid on the wafer evaporates faster and more efficient than standard room temperature DI water. However, hot water often introduces stains on the wafer, and also promotes build-up of bacterial and other particles. Hot water can also create damage to the semiconductor, thereby reducing the amount of good dies on the wafer. Another limitation is water is often expensive to heat, and hot DI water is also an aggressive solvent. As an aggressive solvent, it often deteriorates equipment and facilities, thereby increasing maintenance operation costs.

As line size becomes smaller and the complexity of semiconductor integrated circuits increases, it is clearly desirable to have a rinse/dry method and apparatus that actually removes particles, prevents additional particles, and does not introduce stains on the wafers. The rinse/dry technique should also dry the wafers, without other adverse results. A further desirable characteristic of a dryer includes reducing or possibly eliminating the residual water left on wafer surfaces and edges when water is removed (a meniscus). The water left on such surfaces and edges often attracts and introduces more particles onto the semiconductor wafer. The aforementioned conventional techniques often fail to provide such desired features, thereby reducing the die yield on the semiconductor during wet processes.

From the above, it is seen that a rinse/dry method and apparatus for semiconductor integrated circuits that is safe, efficient, and economical is often desired.

SUMMARY OF THE INVENTION

The present invention provides a safe, efficient, and economical method and apparatus to rinse and dry a semiconductor wafer. In particular, the present method provides an improved technique that actually reduces the amount of particles from the semiconductor wafer and also effectively dries the semiconductor. The present method also provides an in situ rinse/dry system with substantially no mechanical movement of the wafer.

In a specific embodiment, a method for drying a semiconductor wafer includes immersing a partially completed semiconductor wafer in a liquid having water and displacing the liquid with a gaseous mixture having a polar organic compound. The polar organic compound is a non-saturated gaseous polar organic vapor. As for the liquid, it is being displaced adjacent to a face of the partially completed wafer, which is typically at a small angle from vertical.

An alternative specific embodiment provides a system for wet processing. The present system includes an inlet coupled to a fluid source, and a filter coupled to the inlet. The present system also includes a sealed vessel coupled to the filter where the sealed vessel has a lower liquid portion and an upper vapor portion. The present system further includes an outlet coupled to the sealed vessel. The outlet is attached to the lower liquid portion. A solvent injector coupled to the sealed vessel is also used. The solvent injector is coupled to the upper vapor portion, and supplies a gaseous mixture including a polar organic compound. The polar organic compound is a non-saturated polar organic vapor. The present system also includes a gas source coupled to the sealed vessel. The gas source is coupled to the upper vapor portion, and supplies an inert gas into the upper vapor portion. A valve for removing the liquid from the lower liquid portion at substantially a constant liquid level rate is also included.

A further alternative specific embodiment includes a method for rinsing and drying a semiconductor wafer. The present method includes immersing a partially completed wafer into a vessel having ultra purified water. The partially completed wafer is positioned at a slight angle from vertical. The present method also includes a step of sealing the vessel to form a sealed vessel with a lower liquid portion and upper vapor portion. The method further includes steps of purging the upper vapor portion with an inert gas, and displacing the ultra purified water with a gaseous mixture including the inert gas and a polar organic compound. The polar organic compound is a non-saturated polar organic compound vapor.

Still a further alternative specific embodiment includes a method for drying an article of manufacture. The present method includes immersing an article of manufacture into a vessel having water, and sealing the vessel to form a sealed vessel with a lower liquid portion and upper vapor portion. The article of manufacture is positioned at a slight angle from vertical. The present method also includes a step of purging the upper vapor portion with an inert gas and displacing the water with a gaseous mixture including an inert gas and a polar organic compound. The polar organic compound is a non-saturated polar organic vapor.

In still a further specific embodiment a method of removing a liquid from a semiconductor wafer is provided. The present method includes a step of immersing a wafer carrier with semiconductor wafers in a liquid having water. The semiconductor wafers are set at an angle less than 90 degrees as measured from a horizontal line tangent to a top portion of the wafer. The present method also includes a step of elevating the wafer from a bottom wafer edge with a wafer support, and displacing the liquid from the semiconductor wafer with a gas. The lifted wafer is supported in a vertical direction by the wafer support. In a modification to the embodiment, the wafer carrier is placed on a wafer carrier support disposed on each side of the wafer support. The wafer carrier support includes a top surface to tilt the wafer carrier at an angle not exceeding 15 degrees as measured from a horizontal line to a bottom portion of the wafer.

A further understanding of the nature and advantages of the present invention may be realized by reference to the latter portions of the specification and attached drawings.

DESCRIPTION OF THE SPECIFIC EMBODIMENT

Present Rinse/Dry Systems

Figure 1:
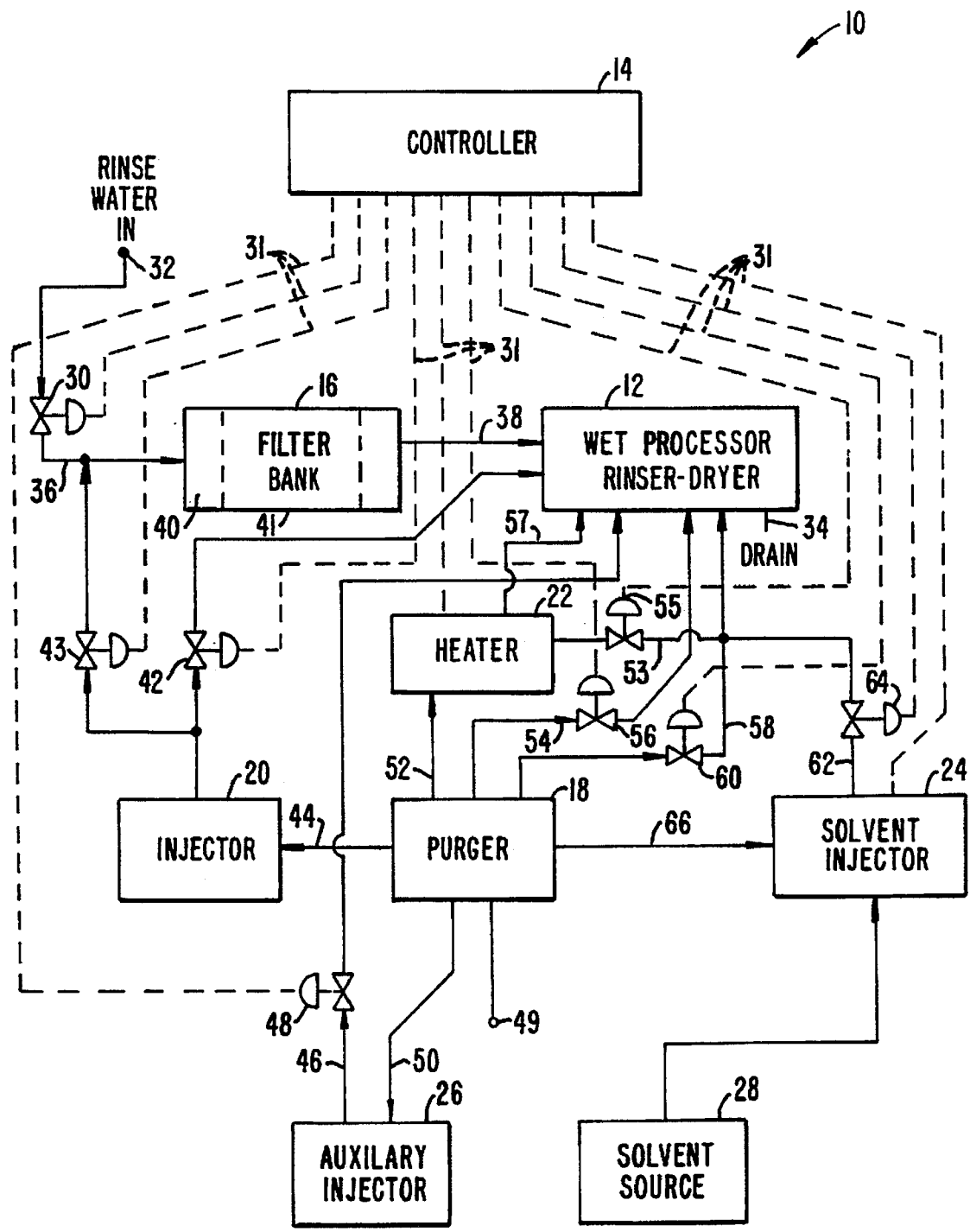
FIG. 1 is a simplified block diagram of an embodiment of the rinse/dry system according to the present invention.

FIG. 1 illustrates in block diagram form an embodiment of the rinse/dry system 10 according to the present invention. The system 10 includes elements such as a wet processor (rinser/dryer) 12, a controller 14, a filter bank 16, a purger 18, an injector 20, a heater 22, a solvent injector 24, an auxiliary injector 26, and a solvent source 28. The system also includes a plurality of flow control valves 30. Each of the flow control valves is operably coupled to the controller 14 and at least one of the aforementioned elements, as shown by dashed lines 31. The solid lines represent lines used to transfer fluids between each of the system elements. A rinse water source 32 and drain 34 are also shown.

Rinse water enters the system at the rinse water source 32. A control valve at the rinse water source 32 controls the flow of rinse water via the controller 14, operably coupled to the control valve 30. The rinse water is a filtered liquid such as deionized (DI) water, among others. Typically the DI water originates from a DI water pad, often outside a wafer fabrication plant.

The filter bank can be any suitable combination of filters, typically used for point of use applications. The filter bank connects to the rinse water source through a line 36 and connects to the wet processor through a line 38. The filter bank includes an ultraviolet purification unit 40, a filter combination of charged and neutral filters 41, among others. An example of charged filters are described and illustrated in application Ser. No. 08/285,316, entitled METHOD AND APPARATUS FOR DELIVERING ULTRA-LOW PARTICLE COUNTS IN SEMICONDUCTOR MANUFACTURING (hereinafter "METHOD AND APPARATUS FOR DELIVERING ULTRA-LOW PARTICLE COUNTS IN SEMICONDUCTOR MANUFACTURING") assigned to the present assignee, and hereby incorporated by reference for all purposes. The filter bank provides for ultra-purified DI water with particles no greater than 0.5 microns in diameter, and preferably 0.1 microns in diameter and less.

The filter bank also provides for a nominal pressure drop therethrough. The pressure drop is less than about 15 pounds per square inch, and preferably less than about 5 pounds per square inch. A higher flow rate is achieved through the filter bank without auxiliary pumps or flow/pressure enhancing devices.

The injector 20 can be any suitable injector for reducing or preferably eliminating bacteria or any living organisms from the lines and system elements. Preferably, the injector 20 is a hydrogen peroxide injector. An example of a hydrogen peroxide injector is discussed in METHOD AND APPARATUS FOR DELIVERING ULTRA-LOW PARTICLE COUNTS IN SEMICONDUCTOR MANUFACTURING. The hydrogen peroxide injector connects to at least the filter bank 20 via source line 32 and the wet processor 12. A control valve 42 meters hydrogen peroxide into the wet processor 12, and a control valve 43 meters hydrogen peroxide into the filter bank 16. Preferably, the controller 14 meters such hydrogen peroxide into the system elements such as the wet processor 12 and the filter bank 16, among others during system maintenance, and other desirable times. The injector also connects via line 44 to the purger 18. The purger provides clean pressurized gas to the injector to allow such hydrogen peroxide to be introduced into the aforementioned system elements without other auxiliary devices. Of course, the type of injector used depends upon the particular application.

A use of another chemical such as a solvent, conventional acid, surfactant, cleaning solution, or the like is optionally introduced through the auxiliary injector 26. The auxiliary injector connects to the wet processor through a line 46, and is controlled by a control valve 48 operably coupled to the controller 14. A purger supplying pressurized gas also connects to the auxiliary injector 26 through a line 50. An example of an auxiliary injector and its operation is also illustrated in the METHOD AND APPARATUS FOR DELIVERING ULTRA-LOW PARTICLE COUNTS IN SEMICONDUCTOR MANUFACTURING. Of course, the type of auxiliary injector used depends upon the particular application.

A further system element is the purger 18, often used to supply gas and/or pressure to certain system elements such as the wet processor, and others. The purger can be any suitable type of pressure reduction and/or control means capable of supplying the source gas to certain system elements at the desired pressure and flow rate. The purger connects to a source gas 49 which is often a carrier gas used in the rinse/dry system.

Preferably, the carrier gas is an ultra-purified or electronic grade nitrogen gas, or any suitable carrier gas capable of carrying a certain polar organic solvent into the wet processor at a desired temperature, pressure, and flow rate. The suitable carrier gas also includes a high purity level to prevent contamination of the system elements. An example of a purger is illustrated in the METHOD AND APPARATUS FOR DELIVERING ULTRA-LOW PARTICLE COUNTS IN SEMICONDUCTOR MANUFACTURING. As previously noted, the purger also supplies pressurized carrier gas or pressure to the injector 20 and auxiliary injector 26 through lines 44 and 50, respectively. The purger further supplies carrier gas to the wet processor through certain alternative routes.

A typical route connects the purger 18 to the wet processor 12 through the heater 22 via lines 52 and 57. In this route, the carrier gas is heated at the heater 22 before entering into the wet processor 12 through the line 57. The heater can be any suitable commercially available or custom made heater capable of heating the carrier gas such as nitrogen to a temperature at the wet processor 12 greater than 70° F. and preferably greater than 150° F., but no greater than 200° F. The controller is operably coupled to the heater to adjust the temperature of the carrier gas and turn-on and turn-off the carrier gas at the desired times. The controller also meters the carrier gas into the wet processor at a desired flow rate and time.

Alternatively, the heated carrier gas connects to the solvent injector 24 through a line 53, before entering the wet processor 12. The heated carrier gas mixes and dilutes solvent from the solvent injector 24 before entering the wet processor 12. The controller 14 is operably coupled to a control valve 55 to meter the heated carrier gas to the wet processor 12.

Another alternative route connects the purger 18 directly to the wet processor 12 through a line 54. The controller 14 is operably coupled to a control valve 56 to turn-on and turn-off the carrier gas at the desired times. The controller 14 and the control valve 56 also meter the carrier gas into the wet processor 12 at a desired flow rate and time.

In a further alternative route, the purger 18 connects to the solvent injector 24 through a line 58 before entering the wet processor 12. In this route, the carrier gas mixes with solvent from the solvent injector 24 before entering the wet processor 12. The controller is operably coupled to a control valve 60 that meters the carrier gas to the wet processor through the line 58. Of course, the use of any of these configurations or combinations of such configurations depends upon the particular application.

The controller 14 can be any suitable microprocessor based programmable logic controller, personal computer controller, or the like for process control. A suitable controller includes features such as programmability, reliability, flexibility, and durability from corrosive elements. The suitable controller includes various input/output ports used to provide connections to open and close valves, regulate and meter fluids, among other features. The controller also includes sufficient memory to store process recipes for desired applications. An example of a suitable controller is illustrated in the METHOD AND APPARATUS FOR DELIVERING ULTRA-LOW PARTICLE COUNTS IN SEMICONDUCTOR MANUFACTURING. Of course, the type of controller used depends upon the particular application.

The solvent injector 24 supplies solvent typically with a carrier gas to the wet processor 12 through a line 62. The purger 18 supplies the carrier gas to the solvent injector through a line 66. To regulate or meter the flow of the solvent into the wet processor, the controller operably couples a control valve 64 connected to the line 66, attached to the solvent injector. The system also provides the solvent source 28 such as bottle or canister of the desired chemical.

Figure 2:
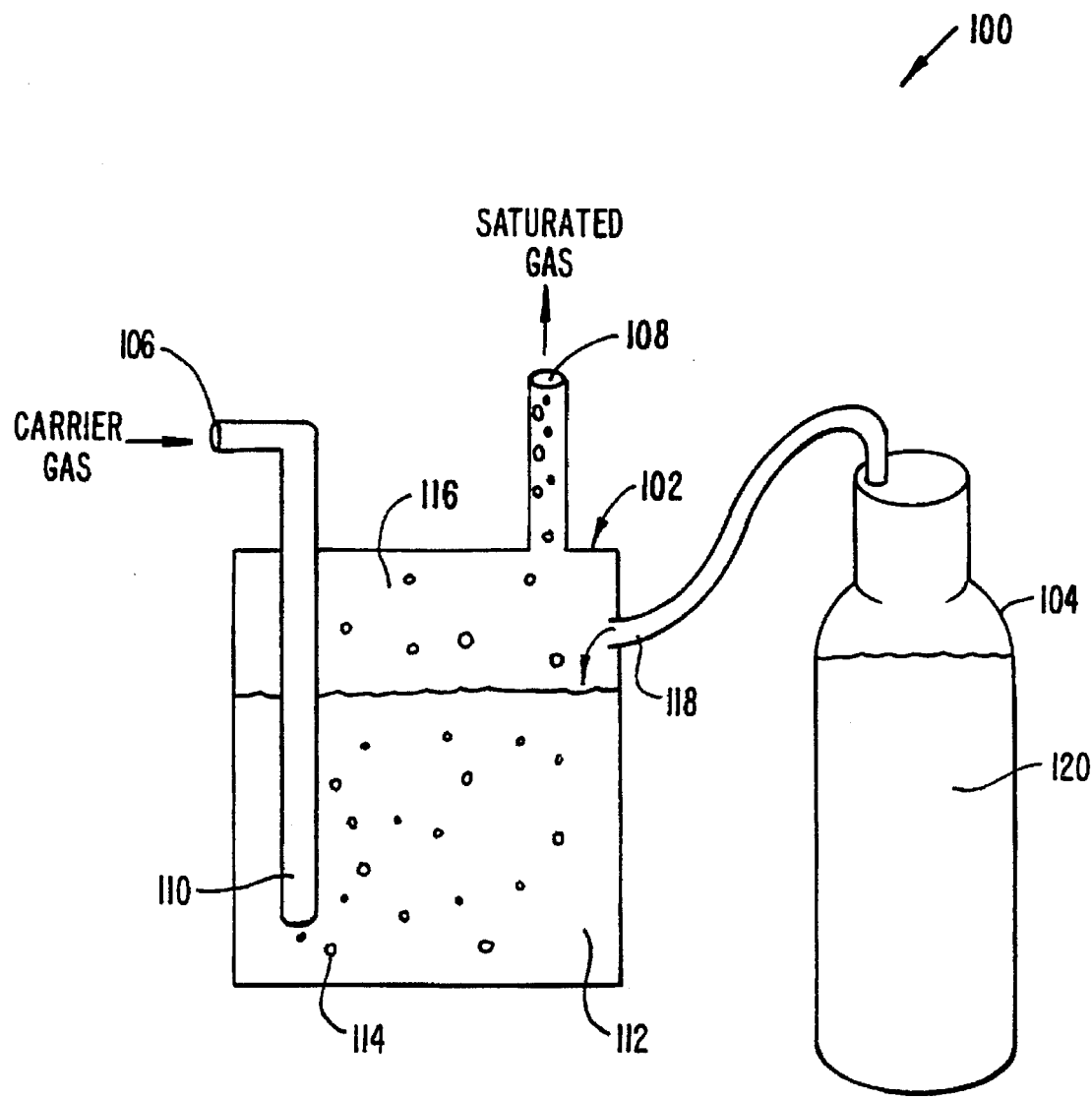
FIG. 2 is a simplified cross-sectional view of a solvent injector according to the present invention.

The solvent injector can be any suitable solvent injector system for use with the wet processor, carrier gas, and solvent. An example of a solvent injector system is represented by the simplified illustration of FIG. 2. The solvent injector system 100 includes a solvent injector vessel 102 and a solvent source 104. The solvent injector vessel 102 connects to a carrier gas source at an inlet 106. A sparger 110 sparges carrier gas 114 as bubbles into the solvent 112 at a lower portion of the solvent injector vessel. As the carrier gas bubbles float up through the solvent, the carrier gas bubbles become saturated with solvent. Carrier gas bubbles saturated with solvent escape into the vapor head space 116 of the solvent injector vessel 102, and exit the solvent injector vessel through outlet line 108. A solvent fill inlet 118 is also connected to the solvent injector vessel 102. A solvent source 104 and solvent 120 are further shown.

Figure 3:
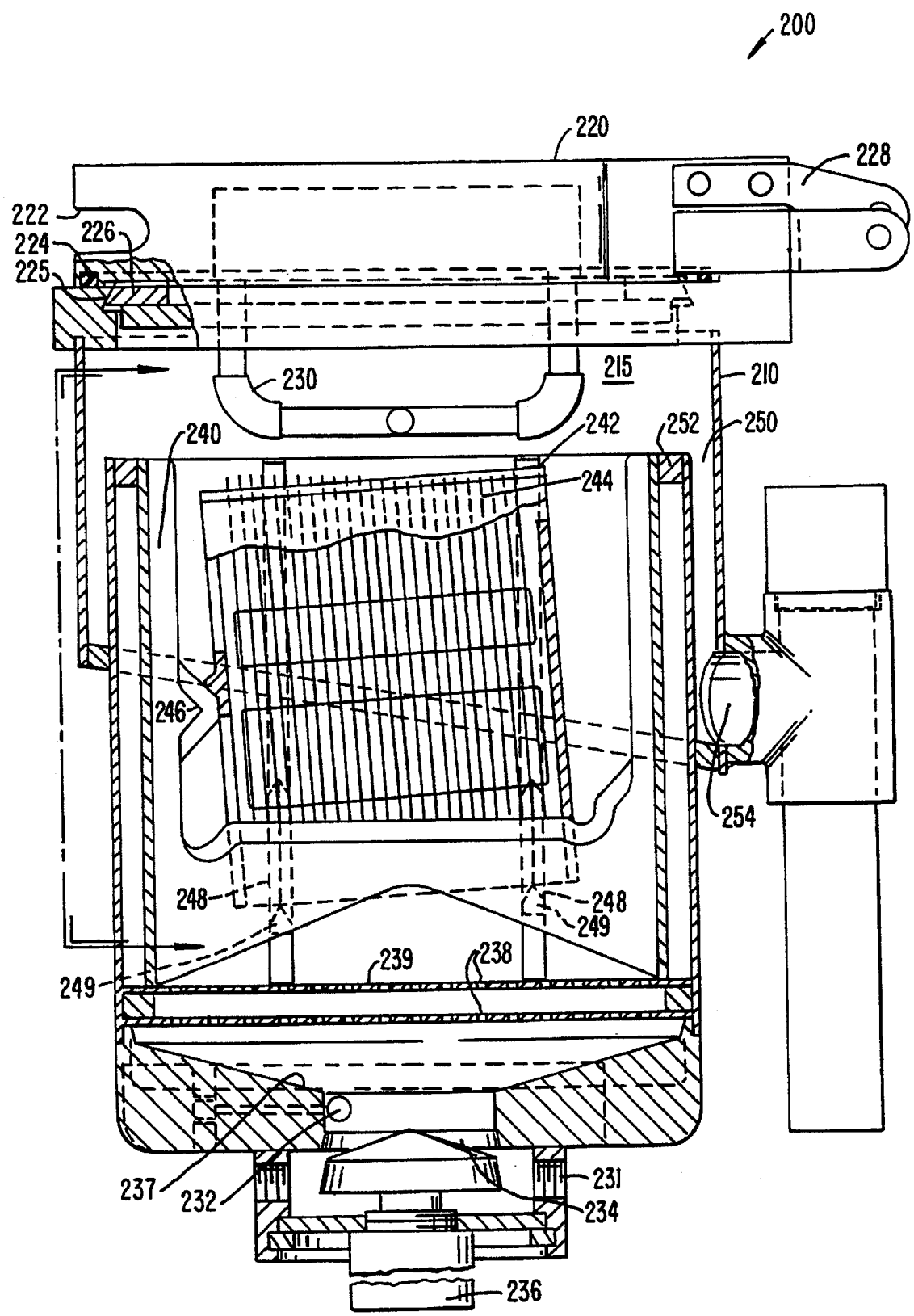
FIG. 3 is a simplified cross-sectional side-view of an embodiment of the rinse chamber.

FIG. 3 is a simplified cross-sectional side-view 200 embodiment of the rinse/dry chamber according to the present invention. The side-view embodiment 200 includes a main chamber 210, a lid 220, a lower drain region 231, and other elements. The main chamber 210 includes the process region 240 (or lower chamber region) and upper chamber region 215. A cascade drain region 250 is also shown. Of course, other chamber elements may also be present depending upon the particular application.

The lid 220 is preferably a sealed lid. The sealed lid includes a handle 222, O-ring type seal 224, a compression ring 226, a hinge 228, a gas inlet 230, among other features. The compression ring 226 provides outward force onto a horizontal portion 225 of the main chamber housing to seal the contents of the main chamber. The O-ring type seal 224 provides a horizontal seal between vertical surfaces of the lid and main chamber housing. The gas inlet 230 includes at least a carrier gas inlet and solvent gas inlet. Of course, the exact configuration of the gas inlet depends upon the particular application.

The process region 240 includes a wafer carrier 242, wafer carrier support 246, 248, and wafer support 249. As will be described in greater detail below, the wafer carrier and wafer support are configured and arranged to minimize liquid accumulation as liquid is drained away in the drying process.

The wafer carrier is a wafer boat or alternatively a half wafer boat or any other type of wafer carrier with a lower profile. The half wafer boat or lower profile boat holds or accumulates less liquid than its full boat counterpart, and therefore drains liquid faster and more easily. The wafer carrier includes wafers 244 disposed within the supports of the wafer carrier. The wafer carrier is supported by a side wafer carrier support 246 and bottom wafer carrier support 248. The side wafer carrier support holds the wafer carrier in place, and prevents such wafer carrier from excessive movement. As shown, the bottom wafer support tilts the wafer carrier in a slight angle from a horizontal position. The angle tends to prevent wafers from sticking to each other during certain rinse and dry operations. The angle from the horizontal position ranges from about 2° to about 15°, and is preferably determined by the characteristics of the particular carrier. By keeping each of the wafers separated, liquid does not accumulate therebetween, thereby decreasing the amount of liquid and therefore particles from accumulating on the wafer.

Each of the wafer carrier support includes a contact point on the wafer carrier to drain liquid such as water from the wafer carrier surface. The contact point is typically a knife edge, serrated edge, or any other shape that breaks the surface tension of the liquid on the wafer carrier surface. By breaking the surface tension of the liquid on the wafer carrier, the liquid with particles drains (or "wicks") off of the wafer carrier more easily. Removing the liquid with particles from the wafer carrier tends to promote drying and rinsing of each of the wafers in a particle free manner.

The wafer support 249 provides lift and a contact point to each of the wafers 244 within the wafer carrier. To more easily appreciate the features of the wafer support, it should be noted that each of the wafers in a conventional wafer carrier touches the wafer carrier in at least three large regions. Each of the wafers is also relatively close to the insides of the wafer carrier. Accordingly, liquid easily accumulates and is often trapped on edges of each of the wafers.

To reduce this effect, the wafer support lifts the wafers in the wafer carrier by elevating each of the wafers in the carrier with a knife edge. By lifting each of the wafers in the wafer carrier, the wafer edges are further away from insides of the carrier, thereby allowing liquid to flow free from the region between the wafer edges and carrier insides. To further promote the removal of liquid from each of the wafers, the knife edge is preferably pointed, serrated, or any other shape that easily breaks the surface tension of the liquid at the bottom of each wafer. By breaking the surface tension of liquid at the wafer bottom edges, liquid flows free from the wafer bottom edges, thereby reducing the meniscus at such edges. The knife edge lifts each of the wafers at least 2 mm from the bottom insides of the carrier, and preferably lifts each of the wafers about 5 mm, but no more than about 20 mm. The wafer carrier support removes liquid such as water from the wafers, thereby decreasing the amount of water and in particular the particles in the water.

To add and drain liquid into the main chamber, and in particular the process region, the lower drain region 231 includes a fill inlet 232 and drain valve 236. The fill inlet provides liquid such as DI water and the like into the process region. The drain valve 236 removes liquid from the process region through the drain outlet 236. A plurality of drain holes 238 also exist at the bottom of the main chamber in the process region to distribute the liquid evenly therethrough. The lower drain region also includes an angled drain floor 237 at the bottom of the main chamber to facilitate liquid transfer, and a flat support surface 239 in the process region to support the wafer carrier support.

A cascade region 250 allows liquid to cascade out into cascade drain region 253. To rinse certain chemicals from the wafer carrier and wafers, ultra-purified DI water enters through the fill inlet 237, rises through the drain holes 238, flows through the process region 240, and cascades over a partition 252 into the cascade drain region 253. This sequence of steps removes excess chemicals such as acids or the like from the wafer carrier and wafers, and also keeps such chemicals from accumulating in the main chamber and in particular the process region.

Figure 4:
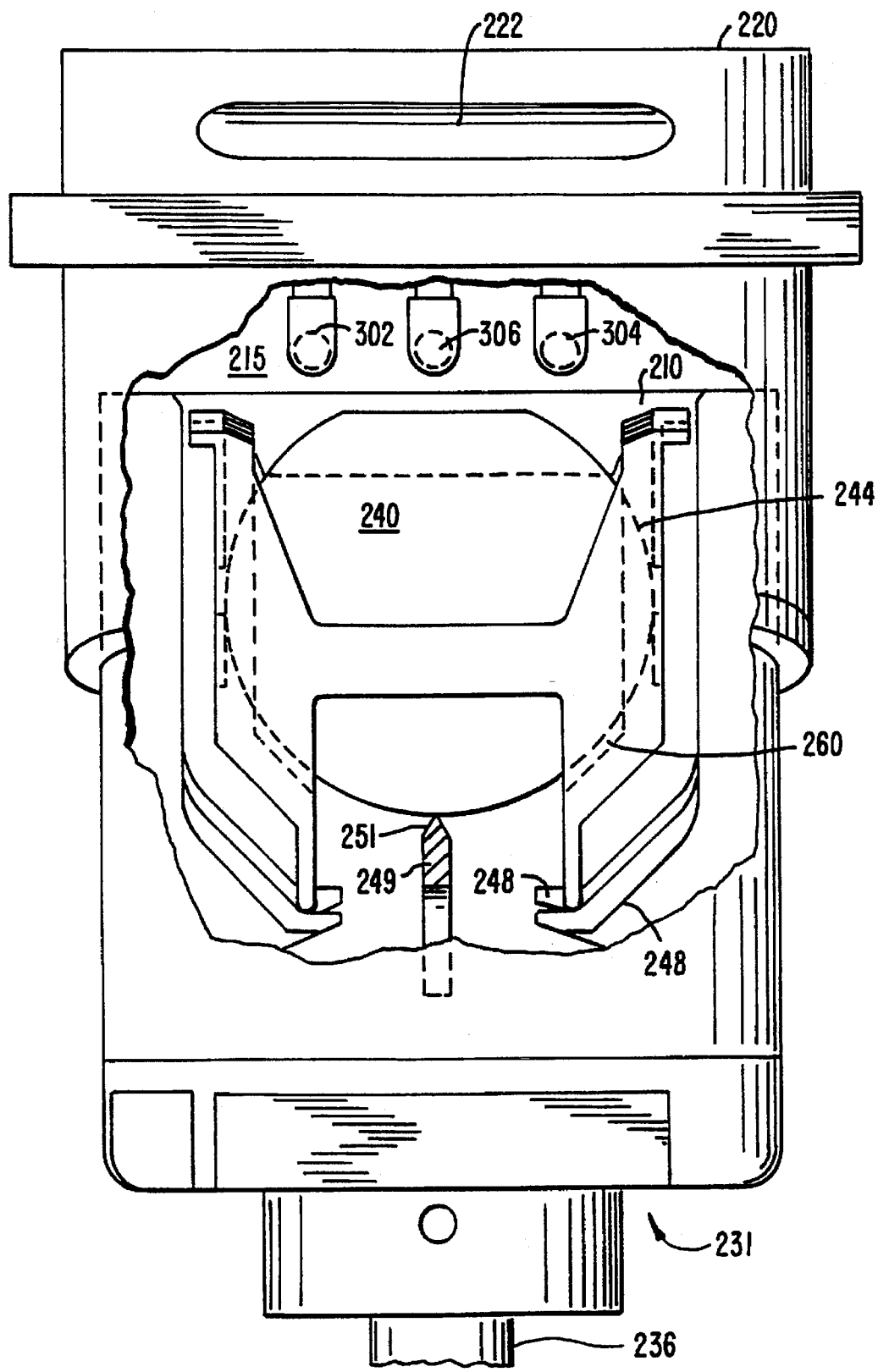
FIG. 4 is a simplified cross-sectional front-view of an embodiment of the rinse chamber.

FIG. 4 illustrates a simplified front view of the rinse/dry chamber according to the present invention. For easy reading, FIG. 4 uses some of the same reference numerals as the FIG. 3 embodiment. The front-view embodiment shows elements such as the main chamber 210, the lid 220, the lower drain region 231, the process region 240, among others. The main chamber 210 includes the process region 240 and upper chamber region 215.

As shown, the wafer support 249 lifts each of the wafers from the wafer carrier to form a gap 260 between wafer edges and wafer carrier insides. The gap prevents liquid from accumulating between such wafer edges and wafer carrier insides. The gap is no greater than about 20 mm, but is larger than about 2 mm. The wafer support is a knife edge with triangular point 251. Other shapes may also be used to break the meniscus at the bottom of the wafer edges and remove water therefrom. The meniscus often forms at the bottom wafer surface and edges as liquid is being removed from the wafers. As previously noted, the meniscus often contains particles, often detrimental to the manufacture of an integrated circuit.

The front view embodiment also shows the wafer carrier support 248. As shown, each of the wafer carrier supports is arranged with different heights, typically lower to higher from one side of the process region to the other side of the process region. The different heights of the wafer carrier support tilt the position of the wafer carrier from horizontal. The tilt or angle of the wafer carrier also tilts the wafers, thereby preventing such wafers from sticking to each other during certain rinse and dry operations.

The front view further shows certain gas inlets 302, 304, and 306. Each of the gas inlets is a distribution plenum with a plurality of holes for distributing gas evenly over the process region. The embodiment includes two outside carrier gas inlets 302 and 306, and a center solvent gas inlet 304. The carrier gas inlet provides ultra-pure nitrogen to purge the main chamber from the environment, thereby creating an ultra-clean main process region. Of course, the number of inlets and their use depend upon the particular application.

Present Rinse/Dry Methods

Figure 5:
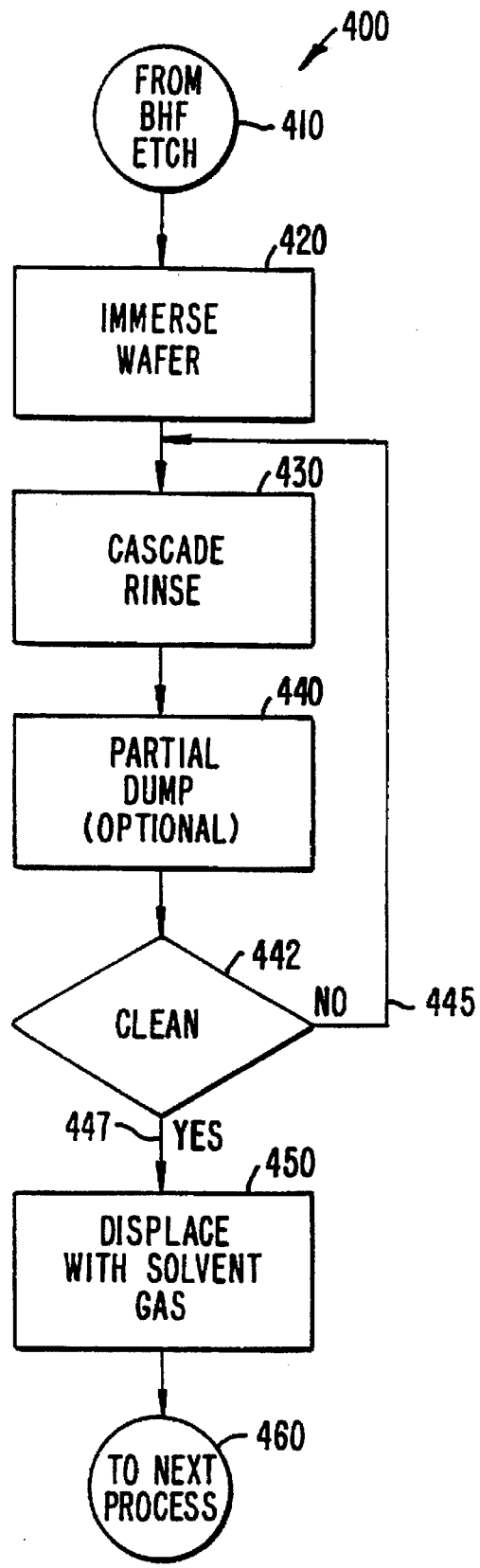
FIG. 5 is a simplified flow diagram of an embodiment of the rinse/dry method according to the present invention.

FIG. 5 is a simplified flow diagram 400 of an embodiment of a rinse/dry method according to the present invention. The rinse method is illustrated as a rinse/dry method for a recently wet etched wafer. The wet etched wafer for illustrative purposes only is etched in a solution of hydrofluoric acid (HF) or buffered hydrofluoric acid (BHF). Hydrofluoric acid is often used to remove oxides from surfaces of a semiconductor wafer. As merely an example, this embodiment should not be taken as limiting the scope of the present invention.

The flow diagram begins 400 by receiving a recently etched wafer (etched wafer) 410 from the BHF etch. The etched wafer has no oxide layer thereon from the BHF etch, and is predominately hydrophobic in characteristic. A step 420 of immersing the etched wafer in the bath of ultra-purified DI water follows. The etched wafer is immersed into the DI water from the acid bath in about 5.0 seconds or less, and preferably about 2.5 seconds and less.

The step of immersing the etched wafer immediately into the DI water substantially prevents formation of silicon dioxide from the oxygen in air, and promotes the formation of a thin but clean high grade silicon dioxide layer from the ultra-purified DI water. The DI water is substantially free from particles and therefore forms a substantially particle free silicon dioxide layer.

To remove acid such as the HF from the surface of the wafer, the ultra-purified DI water in the main chamber (or vessel) flows across the wafer and cascades over into a drain. The DI water cascade carries excess acid into the drain and reduces the acid concentration in the vessel.

Optionally, the DI water in the vessel may be removed by dumping it (step 440) into a bottom drain dump. Preferably, the dumping step is a partial dump, and not a complete dump or removal of DI water. During the removal of the DI water, a clean inert gas displaces the DI water. A typical inert gas includes filtered nitrogen and others.

After displacing the DI water with the clean inert gas, clean DI water from the DI water source flows into the main chamber to cover the surface area of the wafer. These aforementioned steps may be repeated (branch 445) alone or in any combination until substantially no residual acid exists (test 442) on the wafer.

When residual acid has been substantially removed from the wafer, a carrier gas including a polar organic compound displaces 450 the DI water. The carrier gas is preferably nitrogen with a trace of polar organic compound such as isopropyl alcohol, 1-methoxy-2-propanol, di-acetone alcohol, and others. For a typical batch of wafers in a conventional wafer boat, the amount of organic solvent used is preferably less than a milliliter.

The trace of polar organic compound is made by mixing the carrier gas with a saturated bubble of polar organic compound. The saturated polar organic compound bubble is made by flowing cold or warm nitrogen through a solution of polar organic compound at a rate of about 3 cubic feet/min. or less. The saturated polar organic compound bubble then mixes with either cold nitrogen at a flow rate of about 5 cubic feet/min. and less, or hot nitrogen at a flow rate of about 10 cubic feet/min. and less. A temperature of such hot nitrogen carrier gas is at about 70° F. and higher, but preferably about 185° F. and less. By mixing nitrogen gas with the saturated polar organic compound bubble, the polar organic compound is a non-saturated vapor in the main chamber.

The carrier gas including the polar organic compound comes in contact with the DI water which is being drained at a slow rate removing water from the surface of the wafer, and also tends remove particles from such wafer via the DI water. A carrier gas including isopropyl alcohol, di-acetone alcohol, or other polar organic solvents displaces the DI water at a rate of about 10 mm/second or less as measured from the wafer face, and preferably at a rate of about 2 mm/seconds and less.

The carrier gas including the polar organic compound is believed to remove a portion of the liquid on the wafer surface through the Marongoni effect, as further described in J. Marra, ULTRACLEAN MARANGONI DRYING, *Particles in Gases and Liquids* 3: *Detection, Characterization, and Control*, Edited by K. L. Mittal, Plenum Press, New York, 1993. The Marongoni effect tends to increase flow of liquid from the wafer surface through use of a solvent vapor, but may not remove all liquid from the wafer surface.

Another method to rinse and dry HF etched wafer includes a certain sequence of the aforementioned steps. A solution of HF etches silicon dioxide off the semiconductor wafer. To stop etching, the wafer is quickly immersed into ultra-pure DI water in a vessel. After immersing the etched wafer into the DI water, the vessel is purged with filtered nitrogen gas. The nitrogen gas flows at a rate of ranging from about 2 cubic feet/min. to about 10 cubic feet/min., and is preferably at about 5 cubic feet/min.

To further rinse and remove acid from the wafer, DI water flows past the wafer and cascades from a top portion of the vessel into a drain to cascade rinse the wafer. A quick dump follows the cascade rinse. Preferably, the quick dump occurs at a rate where the liquid level drops at a rate greater than about 40 mm/sec. as measured from a wafer face. During the quick dump, clean nitrogen gas displaces the DI water, thereby preventing any oxidation of the wafer from air. Clean DI water fills the vessel and displaces the nitrogen to re-immerse the wafer in the DI water.

A carrier gas including a polar organic compound then slowly displaces the DI water to remove substantially all acid off the wafer. The slow displacement step substantially eliminates any water from the wafer edges (a meniscus). After another sequence of quick DI water fills and partial dumps, another gaseous mixture including carrier gas and polar organic compound displaces the DI water. Substantially all water is removed from the wafer at this time. To further dry the wafer and carrier, warm or hot nitrogen is introduced into the vessel. The nitrogen includes a temperature ranging from about 70° F. to about 185° F.

The aforementioned methods also include the use of certain wafer support and wafer carrier support to wick or draw liquid away from the wafer. For example, the wafer support includes a knife edge that lifts the wafers to prevent accumulation of water at the wafer edges, and in particular the wafer bottom edges. The wafer carrier support wicks or draws the water from the surface of the wafer carrier, and also puts a slight tilt from horizontal on such carrier.

The slight tilt of the wafer carrier also tilts the wafers, which tends to prevent them from sticking to each other. As previously noted, sticking wafers often accumulate water therebetween. The accumulation of water also accumulates particles, which may be in the water. By removing the water and particles from the wafer, the present method provides higher device yields on a typical semiconductor wafer.

In addition, the aforementioned rinse/dry method occurs without movement of the wafer. In fact, the wafer carrier remains substantially stationary after being immersed, and during the drying, cascade rinse, and other steps. By way of less movement, the system has fewer mechanical parts and is often easier to use and maintain than certain prior art systems.

Moreover, the amount of polar organic compound used for each batch of wafers is typically less than a fraction of a millimeter. The use of less organic compounds is often advantageous to the highly flammable prior art methods of drying a wafer by way of IPA for example. Accordingly, the present method is less hazardous than certain prior art methods to both health and environment.

While the above is a full description of the specific embodiments, various modifications, alternative constructions, and equivalents may be used. For example, while the description above is in terms of a method and apparatus for semiconductor wafers, it would be possible to implement the present invention to the manufacture of raw wafers, disks and heads, flat panel displays, microelectronic masks, and other applications requiring high purity wet processing such as steps of rinsing, drying, and the like. In addition, the systems of FIGS. 1–4 are in terms of a rinse/dry system for semiconductors. A skilled artisan may, alteratively, employ such systems to other industries such as electro-chemical, pharmaceutical, printed circuit board, optical devices, and any other industry that needs an improved technique to rinse and dry an article of manufacture.

Therefore, the above description and illustrations should not be taken as limiting the scope of the present invention which is defined by the appended claims.

What is claimed is:

1. A method of removing a liquid from a plurality of semiconductor wafers disposed within wafer supports in a wafer carrier, the method comprising the steps of:

immersing said wafer carrier with said semiconductor wafers disposed therein in a liquid comprising water, said wafers being disposed below a liquid level;

supporting said semiconductor wafers in said wafer carrier at an acute angle from vertical so as to prevent said semiconductor wafers from touching each other;

causing said liquid level to drop from a first position above said semiconductor wafers to a second position below said semiconductor wafers; and maintaining said semiconductor wafers substantially stationary and at said acute angle from vertical while said liquid level is dropping from said first position to said second position, whereupon said wafers continue to be prevented from touching each other so that said liquid does not get trapped between adjacent wafers.

2. The method of claim 1 wherein said semiconductor wafers are elevated within said wafer carrier by a distance ranging from about 2 mm to about 20 mm from a support in said carrier while said liquid level is dropping from said first position to said second position.

3. The method of claim 1 wherein said step of supporting said semiconductor wafers in a wafer carrier includes placing said wafer carrier on a wafer boat support, said wafer boat support comprising a top surface to tilt said wafer carrier at an angle not exceeding 15 degrees from horizontal.

4. The method of claim 1 wherein said liquid is substantially free from particles greater than about 0.2 microns in diameter to allow said liquid level to drop without adding particles onto said semiconductor wafers.

5. The method of claim 4 wherein said liquid is filtered.

6. The method of claim 5 wherein said liquid is passed through an ultraviolet purification unit.

7. The method of claim 1 wherein:

said step of causing said liquid level to drop has associated therewith a gas displacing said liquid; and said gas includes a non-saturated vapor of polar organic compound, said polar organic compound including one selected from a group consisting of isopropyl alcohol, 1-methoxy-2-propanol, or di-acetone alcohol.

8. The method of claim 1 wherein said acute angle is less than about 15 degrees and greater than 2 degrees.

9. The method of claim 1 wherein said semiconductor wafers are substantially free from oxidation.

10. The method of claim 1 wherein said semiconductor wafers are recently etched wafers.

11. The method of claim 1 wherein:

said step of causing said liquid level to drop has associated therewith a gas displacing said liquid; and said gas comprises substantially a gas that does not substantially react with said semiconductor wafers.

12. The method of claim 11 wherein said gas is nitrogen gas.

13. The method of claim 12 wherein said nitrogen gas is at a temperature greater than about 70° F.

14. The method of claim 1 wherein said semiconductor wafers after said displacing step are substantially dry.

15. The method of claim 1 wherein said causing step occurs at substantially a constant rate, said liquid including a liquid level that drops at a rate not exceeding about 10 mm/sec. as measured along a face of said semiconductor wafers.

16. The method of claim 1 wherein said causing step occurs at substantially a constant rate, said liquid including a liquid level that drops at a rate not exceeding about 2 mm/sec. as measured along a face of said semiconductor wafers.

17. A method for cleaning semiconductor wafers and removing attached particles therefrom, said method comprising steps of:

providing a semiconductor wafer having attached particles, at least some of said attached particles being greater than about 0.1 micron in diameter;

immersing said semiconductor wafer in a cleaning liquid, said cleaning liquid substantially free from particles greater than about 0.1 micron in diameter;

supporting said semiconductor wafer by a wafer support, said wafer support having a knife edge contacting an edge of said semiconductor wafer; and dropping a liquid level of said cleaning liquid while maintaining said semiconductor wafer substantially stationary to prevent a possibility of damage to said semiconductor wafer, said cleaning liquid pulling at least some of said attached particles from said semiconductor wafer during said dropping;

wherein said rate is no greater than about 4.0 mm/sec. as measured along a face of said semiconductor wafer.

18. The method of claim 17 further comprising a step of introducing a gaseous mixture to replace said cleaning liquid, said gaseous mixture comprising substantially carrier gas and a non-saturated vapor of a polar organic compound.

19. The method of claim 18 wherein said non-saturated vapor of polar organic compound causes at least some of said attached particles to be removed from said semiconductor wafer.

20. The method of claim 18 wherein said polar organic compound includes one selected from a group consisting of isopropyl alcohol, 1-methoxy-2-propanol, or di-acetone alcohol.

21. The method of claim 18 wherein said carrier gas is at a temperature greater than about 70° F.

22. The method of claim 7 or 18 wherein said polar organic compound is less than a milliliter.

23. The method of claim 17 wherein said rate is no greater than about 2.5 mm/sec. as measured along said face of said semiconductor wafer.

24. The method of claim 17 wherein said semiconductor wafer is a recently etched wafer.

25. The method of claim 17 further comprising a step of immersing said semiconductor wafer with said cleaning liquid and cascading said cleaning liquid.

26. The method of claim 25 further comprising quick dumping said cleaning liquid.

27. The method of claim 17 wherein said rate is substantially a constant rate as measured along said face.

28. The method of claim 17 further comprising a step of drying including a step of introducing a drying fluid to remove any cleaning liquid from said semiconductor wafer.

* * * * *